US006977181B1

(12) United States Patent
Raberg

(10) Patent No.: US 6,977,181 B1
(45) Date of Patent: Dec. 20, 2005

(54) MTJ STACK WITH CRYSTALLIZATION INHIBITING LAYER

(75) Inventor: Wolfgang Raberg, Fontainebleau (FR)

(73) Assignee: Infincon Technologies AG, Munich (DE)

( * ) Notice: Subject to any disclaimer, the term of this patent is extended or adjusted under 35 U.S.C. 154(b) by 0 days.

(21) Appl. No.: 10/870,780

(22) Filed: Jun. 17, 2004

(51) Int. Cl.$^7$ ............................................. H01L 21/00
(52) U.S. Cl. ............................ 438/3; 438/96; 438/653; 365/158
(58) Field of Search ................ 438/3, 61, 96, 438/238, 653; 365/158, 171, 173

(56) References Cited

U.S. PATENT DOCUMENTS

| 5,702,831 | A | 12/1997 | Chen et al. |
| 5,734,605 | A | 3/1998 | Zhu et al. |
| 6,544,801 | B1 | 4/2003 | Slaughter et al. |
| 6,611,453 | B2 * | 8/2003 | Ning ........................ 365/171 |
| 6,638,774 | B2 | 10/2003 | Raberg |
| 6,713,802 | B1 | 3/2004 | Lee |
| 2001/0041401 | A1 * | 11/2001 | Ahn et al. ................. 438/238 |
| 2002/0097600 | A1 * | 7/2002 | Ning ........................ 365/171 |
| 2003/0073251 | A1 * | 4/2003 | Ning ............................. 438/3 |

OTHER PUBLICATIONS

Fang, et.al., "Crystallization and Failure Behaviors of Ta-Co Nanostructured/Amorphous Diffusion Barriers for Copper Metallization," Rev. Adv. Mater. Sci., 2003, vol. 5, pp. 510-513.

Oizumi et. al., "Control of Crystalline Structure and Electrical Properties of TaSiN Thin Film Formed by Reactive RF-Sputtering," Jpn. J. Appl. Phys., Mar. 2000, vol. 39, pp. 1291-1294.

* cited by examiner

Primary Examiner—Phuc T. Dang
(74) Attorney, Agent, or Firm—Slater & Matsil, L.L.P.

(57) ABSTRACT

A method of forming a magnetic stack and a structure for a magnetic stack of a resistive memory device. A crystallization inhibiting layer is formed over the free layer of a magnetic stack, improving thermal stability. The crystallization inhibiting layer comprises an amorphous material having a higher crystallization temperature than the crystallization temperature of the free layer material. The crystallization inhibiting layer inhibits the crystallization of the underlying free layer, providing improved thermal stability for the resistive memory device.

30 Claims, 4 Drawing Sheets

MTJ STACK WITH CRYSTALLIZATION INHIBITING LAYER

TECHNICAL FIELD

The present invention relates generally to the fabrication of semiconductor devices, and more particularly to the fabrication of magnetic memory devices.

BACKGROUND

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

A recent development in semiconductor memory devices involves spin electronics, which combines semiconductor technology and magnetics. The spin of electrons, rather than the charge, is used to indicate the presence of binary states "1" and "0." One such spin electronic device is a magnetic random access memory (MRAM) device which includes conductive lines (wordlines and bitlines) positioned in a different direction, e.g., perpendicular to one another in different metal layers, the conductive lines sandwiching a magnetic stack or magnetic tunnel junction (MTJ), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1," is storable in the alignment of magnetic moments. The resistance of the magnetic memory cell depends on the moment's alignment. The stored state is read from the magnetic memory cell by detecting the component's resistive state.

MRAM devices are typically arranged in an array of rows and columns and the wordlines and bitlines are activated to access each individual memory cell. In a cross-point MRAM array, current is run through the wordlines and bitlines to select a particular memory cell. In a field effect transistor (FET) array, each MTJ is disposed proximate a FET, and the FET for each MTJ is used to select a particular memory cell in the array. In a FET array, an electrode is typically formed between the MTJ and the FET to make electrical contact between the MTJ and the FET.

An advantage of MRAM devices compared to traditional semiconductor memory devices such as dynamic random access memory (DRAM) devices is that MRAM devices are non-volatile. For example, a personal computer (PC) utilizing MRAM devices would not have a long "boot-up" time as with conventional PCs that utilize DRAM devices. Also, an MRAM device does not need to be continually powered to "remember" the stored data. Therefore, it is expected that MRAM devices will replace flash memory, DRAM and static random access memory (SRAM) devices in electronic applications where a memory device is needed.

Because MRAM devices operate differently than traditional memory devices and because they are relatively new, they introduce design and manufacturing challenges. For example, improved methods of forming resistive memory elements are needed.

SUMMARY OF THE INVENTION

Embodiments of the present invention provide novel methods of forming a magnetic stack and fabricating magnetic memory cells of an MRAM device. Embodiments of the present invention provide methods of forming a magnetic stack of magnetic memory devices and structures thereof having improved thermal stability, by disposing an amorphous material having a higher crystallization temperature than the crystallization temperature of the free layer over the free layer of a resistive memory element.

In accordance with a preferred embodiment of the present invention, a method of manufacturing a magnetic stack of a resistive memory device over a workpiece includes depositing a first magnetic material layer over the workpiece, depositing a tunnel insulator over the first magnetic material layer, depositing a second magnetic material layer over the tunnel insulator, and depositing a crystallization inhibiting layer over the second magnetic material layer. The crystallization inhibiting layer comprises a material selected from the group consisting of: materials of the form MSiN, wherein M is a metal; TaCo; $TiPN_2$; $W_{85}Si_{15}$; IrTa; and TaRu.

In accordance with another preferred embodiment of the present invention, a magnetic stack of a resistive memory device includes a first magnetic material layer, a tunnel insulator disposed over the first magnetic material layer, a second magnetic material layer disposed over the tunnel insulator, and a crystallization inhibiting layer disposed over the second magnetic material layer. The crystallization inhibiting layer comprises a material selected from the group consisting of: materials of the form MSiN, wherein M is a metal; TaCo; $TiPN_2$; $W_{85}Si_{15}$; IrTa; and TaRu.

Advantages of preferred embodiments of the present invention include providing a resistive memory element and method of manufacture thereof having improved thermal stability, improved coercitivity $H_c$, and CMOS compatibility. The crystallization inhibiting layer advantageously may also function as a diffusion barrier.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a magnetic stack implemented in an MRAM array. Embodiments of the present invention may also be applied, however, to other resistive memory device applications, magnetic memory cell designs, and magnetic semiconductor device applications, as examples. The present invention is particularly beneficial when implemented in the manufacture of FET and crosspoint MRAM arrays, as examples.

A prior art MRAM design structure will be described, followed by a discussion of a less preferred embodiment of a magnetic stack, preferred embodiments and exemplary implementations of the present invention, and some advantages of embodiments of the present invention.

Figure 1:
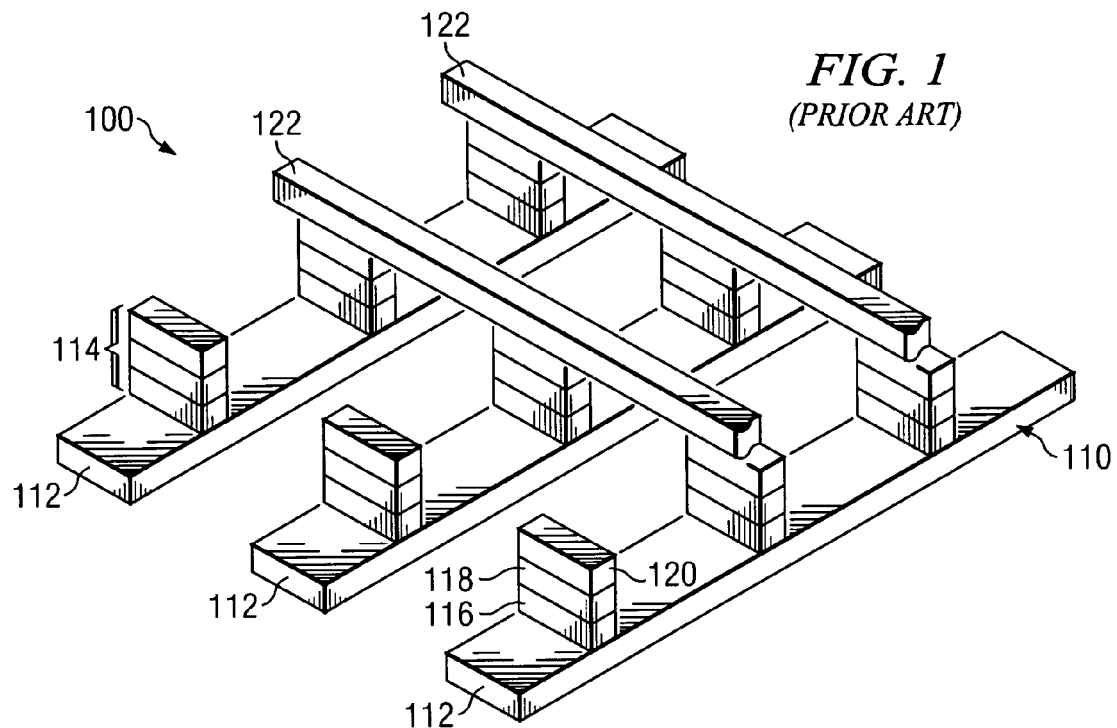
FIG. 1 illustrates a perspective view of a prior art MRAM array.

FIG. 1 illustrates a perspective view of a prior art crosspoint MRAM 100 device having bitlines 112 located substantially perpendicular to wordlines 122 in adjacent metallization layers. Magnetic stacks 114 are positioned between the bitlines 112 and wordlines 122 adjacent and electrically coupled to bitlines 112 and wordlines 122. The magnetic stacks 114 are also referred to herein as resistive memory elements or MTJ's.

A typical manufacturing process for the MRAM device 100 of FIG. 1 will next be described. A workpiece (not shown) is provided, typically comprising silicon oxide over silicon single-crystal silicon, for example. The workpiece may include other conductive layers or other semiconductor elements, e.g., transistors, diodes, etc. Compound semiconductors such as GaAs, InP, Si/Ge, and SiC may be used in place of silicon, for example.

A first inter-level dielectric layer (not shown) is deposited over the workpiece. The inter-level dielectric may comprise silicon dioxide, for example. The inter-level dielectric layer is patterned, for example, for vias, and etched. The vias may be filled with a metal such as copper, tungsten or other metals, for example.

A metallization layer, e.g., an M2 layer comprising aluminum or copper, is formed next. If copper is used for the first conductive lines 112, typically a damascene process is used to form the first conductive lines 112. A dielectric, not shown, is deposited over inter-level dielectric layer and vias. The dielectric layer is patterned and etched, and the trenches are filled with conductive material to form the first conductive lines 112 in the M2 layer. Alternatively, the first conductive lines 112 may be formed using a subtractive etch process, and a dielectric material may be disposed between the first conductive lines 112.

Next, a magnetic stack 114 is formed over first conductive lines 112. The magnetic stack 114 typically comprises a first magnetic layer 116 including one or more magnetic layers. The first magnetic layer 116 may comprise a plurality of layers of materials such as PtMn, NiMn, IrMn, FeMn, CoFe, Ru, Al, and NiFe, as examples, although alternatively, other materials may be used for the first magnetic layer 116, for example. The first magnetic layer 116 is also referred to as a hard layer or a pinned layer because its magnetic orientation is fixed.

The magnetic stack 114 also includes a thin dielectric layer 118 comprising $Al_xO_y$, e.g., $Al_2O_3$, for example, deposited over the first magnetic layer 116, although alternatively, the dielectric layer 118 may comprise other insulating materials. The dielectric layer 118 is often referred to as a tunnel layer, tunnel junction, or barrier layer.

The magnetic stack 114 also includes a second magnetic layer 120 comprising similar materials as the first magnetic layer 116. The second magnetic layer 116 is often referred to as the soft layer or free layer because its magnetic orientation is changed depending on the desired logic state of the magnetic memory cell.

The first magnetic layer 116, dielectric layer 118 and second magnetic layer 120 are patterned to form a plurality of MTJ's 110, with each MTJ 110 being disposed over a first conductive line 112. The patterned magnetic stacks 114 or MTJ's 110 are typically substantially rectangular or oval in shape, as shown. The MTJ's 110 comprise resistive memory elements, and the terms "MTJ" and "resistive memory element" are used interchangeably herein.

A plurality of second conductive lines 122 is formed over the MTJ's 110. The second conductive lines 122 may be formed within an M3 layer, for example, and are positioned in a different direction than the first conductive lines 112. If the second conductive lines 122 comprise copper, again, a damascene process is typically used to form them. A dielectric layer (not shown) is deposited over the MTJ's 110. The dielectric layer is patterned and etched with trenches that will be filled with a conductive material to form the second conductive lines 122. Alternatively, a non-damascene process may be used to form the first and second conductive lines 112 and 122. Conductive lines 112 and 122 may function as the wordlines and bitlines of the MRAM array 100, as examples.

The order of the magnetic stack 114 layers may be reversed, e.g., the pinned layer 116 may be on the top of or above the insulating layer 118, and the free layer 120 may be on the bottom of or below the insulating layer 118. Similarly, the wordlines 112 and bitlines 122 may be disposed either above or below the magnetic stack layers 114.

In MRAM devices, information is stored in the free layer 120 of the MTJ's 110. To store the information, the magnetization of one ferromagnetic layer or information layer, e.g., the free layer 120, is aligned either parallel or anti-parallel to a second magnetic layer or reference layer, e.g., the pinned layer 116. The information is detectable due to the fact that the resistance of a parallel element is different than an anti-parallel element. Switching from a parallel to an anti-parallel state, and vice versa, may be accomplished by running current, often referred to as the switching current, through both conductive lines 112 and 122, and from the pinned layer 116 to the free layer 120, or vice versa. The switching current induces a magnetic field at the location of the MTJ memory element 110 large enough to change the magnetization of the information layer or free layer 120. Tunneling current is current run through the element that is used for reading the resistive state.

Figure 2:
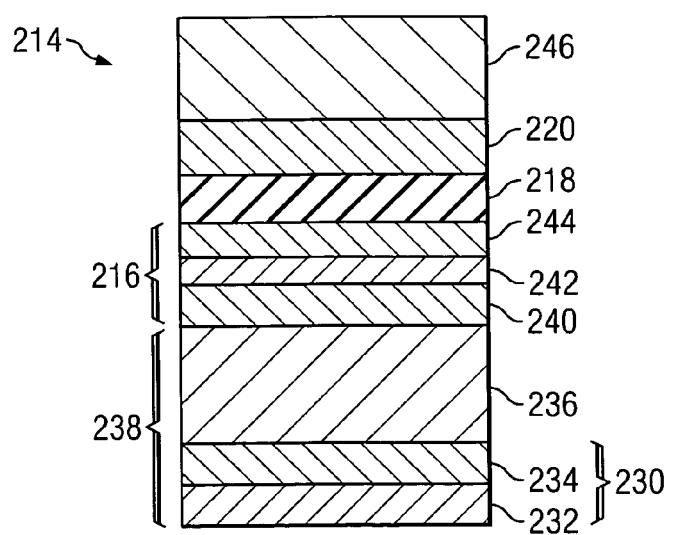
FIG. 2 shows a cross-sectional view of a less preferred embodiment of a magnetic stack structure for a resistive memory element.

A more detailed cross-sectional view of a less-preferred embodiment of a magnetic stack 214 for an MRAM device is shown in FIG. 2. Like numerals are used for the various elements in FIG. 2 as were described with reference to FIG. 1. To avoid repetition, each reference number shown in the diagram may not necessarily be described again in detail herein. Rather, similar materials x16, x18, x20, etc. . . . are preferably used for the material layers shown as were described for FIG. 1, where x=1 in FIG. 1 and x=2 in FIG. 2.

The magnetic stack 214 includes an optional pinning layer 238 disposed over a first insulating layer and first conductive lines (not shown in FIG. 2; refer to FIG. 1). The optional pinning layer 238 comprises a bottom electrode 230 and an antiferromagnetic layer 236 disposed over the bottom electrode 230, as shown. The bottom electrode 230 typically comprises a first layer 232 comprising a conductive material such as TaN, and a second layer 234 comprising a conductive material such as Ta deposited over the first layer 232. The antiferromagnetic layer 236 preferably comprises a Mn-containing material such as PtMn or IrMn deposited over the bottom electrode 230. The first layer 232 of the bottom electrode 230 may comprise a thickness of about 50 to 100 Angstroms, the second layer 234 of the bottom electrode 230 may comprise a thickness of about 50 to 100 Angstroms, and the PtMn layer may comprise a thickness of about 125 to 300 Angstroms, as examples, although alternatively, layers 232, 234 and 236 may comprise other dimensions, for example. The bottom electrode 230 may function as a seed layer for the antiferromagnetic layer 236. The bottom electrode 230 may also function to connect the bottom magnetic layer 216 of the resistive memory cell formed by a patterned magnetic stack 214 to an underlying wordline or access FET, for example (not shown in FIG. 2; see FIG. 4). Thus, the pinning layer 238 functions as a pinning layer for the fixed layer 240 of the magnetic stack 214, by increasing the coercive field of the fixed layer 216, and also may function as a bottom electrode to electrically connect the free layer 240 to an underlying first conductive line, e.g., by a via, to be described further herein with reference to FIG. 4.

If the magnetic stack 214 is used in a FET MRAM array, preferably the optional pinning layer 238 is used, in order to make electrical contact to underlying access FETs and other electrical components. However, in some crosspoint MRAM array designs, a pinning layer 238 may not be required in the magnetic stack 214, but rather, the first magnetic material layer 216 may be formed directly over an underlying wordline or bitline (such as conductive line 112 shown in FIG. 1).

A first magnetic material layer 216 is formed over the pinning layer 238 (or over an underlying first insulating layer, if a pinning layer 238 is not used), as shown in FIG. 2. The first magnetic material layer 216 is also referred to herein as a fixed layer 216 because its magnetic orientation is fixed by the pinning layer 238. The fixed layer 216 is often referred to in the art as a pinned layer, for example. The fixed layer 216 may include a first magnetic layer 240 deposited over the pinning layer 238, a thin spacer layer 242 deposited over the first magnetic layer 240, and a second magnetic layer 244 deposited over the thin spacer layer 242. In the embodiment shown, the fixed layer 216 may comprise two magnetic layers 240 and 244 comprising a material such as NiFe or CoFe having a thickness of about 30 Angstroms each, that sandwich a non-magnetic spacer material 242 such as Ru having a thickness of about 10 Angstroms, as examples. The non-magnetic spacer material 242 anti-couples the two magnetic layers 240 and 244 of the fixed layer 216. The fixed layer 216 may alternatively comprise a single magnetic layer or a plurality of magnetic layers (not shown in FIG. 2; see FIG. 5). For example, the fixed layer 216 may comprise a single layer of magnetic material such as NiFe or CoFe having a thickness of about 30 Angstroms.

A tunnel insulator 218 is formed over the first magnetic material layer 216. The tunnel insulator 218 may comprise about 10 to 15 Angstroms or less of an insulator such as $Al_xO_y$, for example, although alternatively, other insulating materials may be used for the tunnel insulator 218. The tunnel insulator 218 is also referred to as a tunnel barrier or a tunnel junction.

A second magnetic material layer 220 is deposited over the tunnel insulator 218. The second magnetic material layer 220 may comprise a single magnetic layer as shown in FIG. 2, or alternatively, the second magnetic material layer 220 may comprise a plurality of magnetic layers (not shown). Alternatively, the second magnetic material layer 220 may comprise two magnetic layers comprising a material such as NiFe or CoFe having a thickness of about 30 Angstroms each, that sandwich a non-magnetic spacer material such as Ru having a thickness of about 10 Angstroms, as examples, as described for the first magnetic material layer 216 (not shown in FIG. 2; see FIG. 5).

The first magnetic material layer 216 and the second magnetic material layer 220 may comprise one or more magnetic material layers comprising CoFe, NiFe, CoFeB or other magnetic materials, as examples, although alternatively, the first magnetic material layer 216 and the second magnetic material layer 220 may comprise other materials.

The second magnetic material layer 220 is also referred to herein as a free layer 220 because the magnetic polarization direction may rotate depending on the magnetic field, which is how information is written to or stored in a resistive memory cell of an MRAM device. After being patterned, the optional pinning layer 238, the fixed layer 216, the tunnel insulator 218, and the free layer 220 of the magnetic stack 214 (and also top electrode 216, to be described herein) are often collectively referred to as a magnetic tunnel junction (MTJ) or resistive memory element.

A top electrode material 246 is deposited over the free layer 220, as shown. The top electrode material 246 may comprise a first hard mask comprising a conductive material. For example, the top electrode material 246 may comprise a metal such as TiN, and may alternatively comprise TaN, Ta, Ti, Pt, PtMn, Ru, IrMn, or Al, as examples, although the top electrode material 246 may also comprise other materials. The top electrode material 246 may be patterned, using a photoresist as a mask, for example, using lithography techniques, and the top electrode material 246 may be used as a mask to pattern one or more underlying material layers 220, 218, 216 and 238, for example. A second hard mask (not shown) may be used to pattern the pinning layer 238, for example (not shown: see U.S. Pat. No. 6,713,802 entitled "Magnetic Tunnel Junction Patterning Using SiC or SiN," issued on Mar. 30, 2004 to Lee, which is incorporated herein by reference.)

Second conductive lines such as conductive lines 122 shown in FIG. 1 may be formed over the top electrode material 246 in a later manufacturing step, to make electrical contact to the top electrode material 246, not shown.

A problem with the magnetic stack 214 shown in FIG. 2 is that at high temperatures, the magnetic properties of the free layer 220 deteriorate, resulting in decreased performance and in some cases, loss of the ability to store information in a resistive memory cell. For example, if CoFeB is used for the material of the free layer 220, CoFeB crystallizes at about 375 degrees C., which is a relatively low temperature.

In some less preferred magnetic stack designs, the free layer 220 may include a top layer or cap layer (not shown) of about 100 Angstroms of Ta or TaN, for example, to protect the free layer 220 during the patterning process and to function as a diffusion barrier. However, this top layer is not amorphous, but rather, is typically crystalline, and does not improve the thermal stability of the magnetic stack 214. The material of the top layer may interdiffuse into the free layer 220 and/or induce crystallization of the free layer 220, thus resulting in the loss of magnetoresistance, an increase in the coercivity $H_c$ of the free layer 220, and deterioration of the magnetic properties of the magnetic stack 214. Also, material from layers above the top layer of the free layer 220 (e.g., from conductive lines 122 shown in FIG. 1) may diffuse along grain boundaries of the top layer into the free layer 220.

Figure 3:
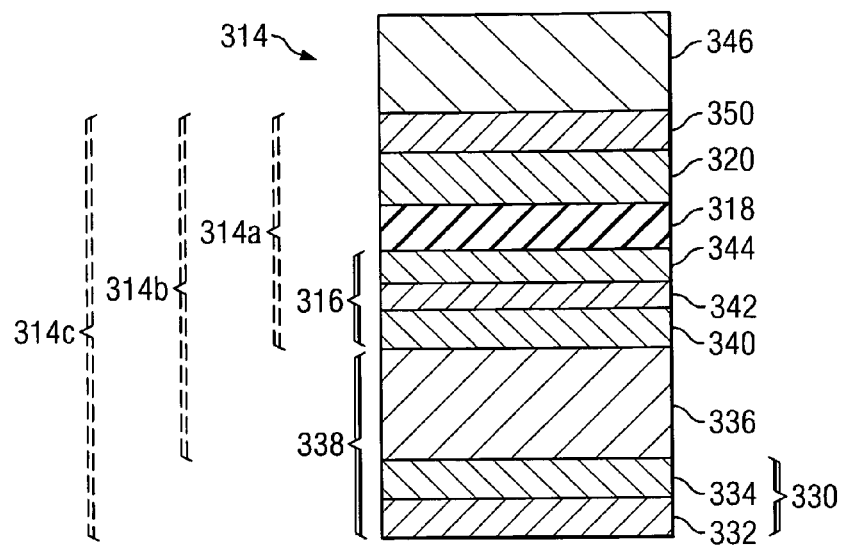
FIG. 3 illustrates in cross-section a magnetic stack structure for a resistive memory element according to an embodiment of the present invention, having a crystallization inhibiting layer formed over the free layer of the magnetic stack, wherein the crystallization inhibiting layer comprises a material that is amorphous and has a higher crystallization temperature than the underlying free layer.

Embodiments of the present invention achieve technical advantages by forming a crystallization inhibiting layer 350 over the free layer 320 of a magnetic material stack 314, as shown in FIG. 3, wherein the crystallization inhibiting layer 350 comprises a material that crystallizes at a temperature higher than the temperature the free layer 320 crystallizes at. The crystallization inhibiting layer 350 improves the performance of the free layer 320 by increasing the thermal stability of the resistive memory cell.

A cross-sectional view of a preferred embodiment of the present invention is shown in FIG. 3. Like numerals are preferably used for the various elements in FIG. 3 as were described with reference to FIGS. 1 and 2. To avoid repetition, each reference number shown in the diagram may not necessarily be described again in detail herein. Rather, similar materials x16, x18, x120, etc. . . . are preferably used for the material layers shown as were described for FIGS. 1 and 2, where x=1 in FIG. 1, x=2 in FIG. 2, and x=3 in FIG. 3. As an example, the preferred and alternative materials and dimensions described for first magnetic material layer 216 in the description for FIG. 2 are preferably also used for the first magnetic material layer 316 in FIG. 3.

The magnetic stack 314 includes a crystallization inhibiting layer 350 formed over the second magnetic material layer 320, as shown. The crystallization inhibiting layer 350 is preferably formed over the second magnetic material layer 320 before the magnetic stack 314 is patterned. For example, the crystallization inhibiting layer 350 is preferably formed over the second magnetic material layer 320 before the hard mask 346 is deposited. According to the particular application of the magnetic stack 314, the term "magnetic stack" may refer only to the fixed layer 316, tunnel insulator 318, free layer 320 and the crystallization inhibiting layer 350, as shown in phantom at 314a. Alternatively, the term magnetic stack 314 may also include the antiferromagnetic layer 336, as shown in phantom at 314b. In other applications, the term magnetic stack 314 may further include the bottom electrode 330, as shown in phantom at 314c, for example. Furthermore, a portion of the bottom electrode 330 e.g., layer 334, may be considered a part of the magnetic stack 314, while portion 332 may not be considered a part of the magnetic stack 314, for example.

The crystallization inhibiting layer 350 preferably comprises an amorphous material that crystallizes at a temperature higher than the temperature the free layer 320 crystallizes at, in accordance with embodiments of the present invention. Preferably, the crystallization inhibiting layer 350 is conductive so that electrical connection is made between the top electrode 346 and the free layer 320. However, alternatively, the crystallization inhibiting layer 350 may comprise insulating materials, if the crystallization inhibiting layer 350 is very thin, e.g., a few Angstroms thick.

In one embodiment, the crystallization inhibiting layer 350 preferably comprises a material of the form MSiN, wherein M=is a metal such as Ta, Ti, Mo, or W, as examples. Alternatively, M may comprise other metals, for example. Such metals of the form MSiN are amorphous within a wide range of compositions and crystallize generally above 600 degrees C.

For example, if the crystallization inhibiting layer 350 comprises TaSiN, TaSiN is amorphous if the ratio of Ta:Si<3, regardless of the N concentration. Crystallization of TaSiN does not occur below about 900 degrees C., for example. Thus, a crystallization inhibiting layer 350 comprising TaSiN substantially improves the thermal stability of the magnetic stack 314 of a resistive memory cell.

In another embodiment, the crystallization inhibiting layer 350 preferably comprises TaCo, which crystallizes at about 600 degrees C., for example. In yet another embodiment, the crystallization inhibiting layer 350 preferably comprises $TiPN_2$, $W_{85}Si_{15}$, or IrTa, as examples. In another embodiment, the crystallization inhibiting layer 350 preferably comprises TaRu.

The crystallization inhibiting layer 350 preferably comprises a thickness of about 200 Angstroms or less, e.g., about 10 to 200 Angstroms. The crystallization inhibiting layer 350 preferably crystallizes at a temperature of greater than about 375 degrees C., in one embodiment. In another embodiment, the crystallization inhibiting layer 350 crystallizes at a temperature of greater than about 400 to 450 degrees C., for example. Alternatively, the crystallization inhibiting layer 350 crystallizes at other temperatures, for example. Preferably, the crystallization inhibiting layer 350 crystallizes at a first temperature, and the second magnetic material layer 320 crystallizes at a second temperature, wherein the first temperature is higher than the second temperature.

In another embodiment, the crystallization inhibiting layer 350 comprises $Al_xO_y$. In this embodiment, preferably the thickness of the crystallization inhibiting layer 350 is thinner, e.g., between about 5 and 20 Angstroms, to allow significant tunneling current. In this embodiment, preferably the resistance of the crystallization inhibiting layer 350 is less than the resistance of the tunnel barrier 318, to avoid loss of magnetoresistance due to series resistance, and to optimize the performance of the resistive memory cell. $Al_xO_y$ is a material that is amorphous and crystallizes at a temperature greater than the temperature at which the free layer 320 crystallizes.

The crystallization inhibiting layer 350 may be deposited using physical vapor deposition (PVD), ion beam deposition, or a sputter deposition, as examples. Alternatively, the crystallization inhibiting layer 350 may be deposited using other deposition methods. Amorphous materials used for diffusion barriers in copper technology that have a crystallization temperature higher than the temperature of the material of the free layer 320 may also be used for the crystallization inhibiting layer 350, for example.

Because the crystallization inhibiting layer 350 is amorphous and crystallizes at a higher temperature than the temperature the free layer 320 material crystallizes at, the crystallization inhibiting layer 350 prevents the free layer 320 from crystallizing when the magnetic stack 314 is heated. Thus, a resistive memory cell formed from the magnetic stack 314 has a tunnel junction that has increased thermal stability.

Because the material used for the tunnel insulator 318 is also amorphous, the free layer 320 is sandwiched by two amorphous material layers 350 and 318, which further improves the thermal stability of the magnetic stack 314.

Figure 4:
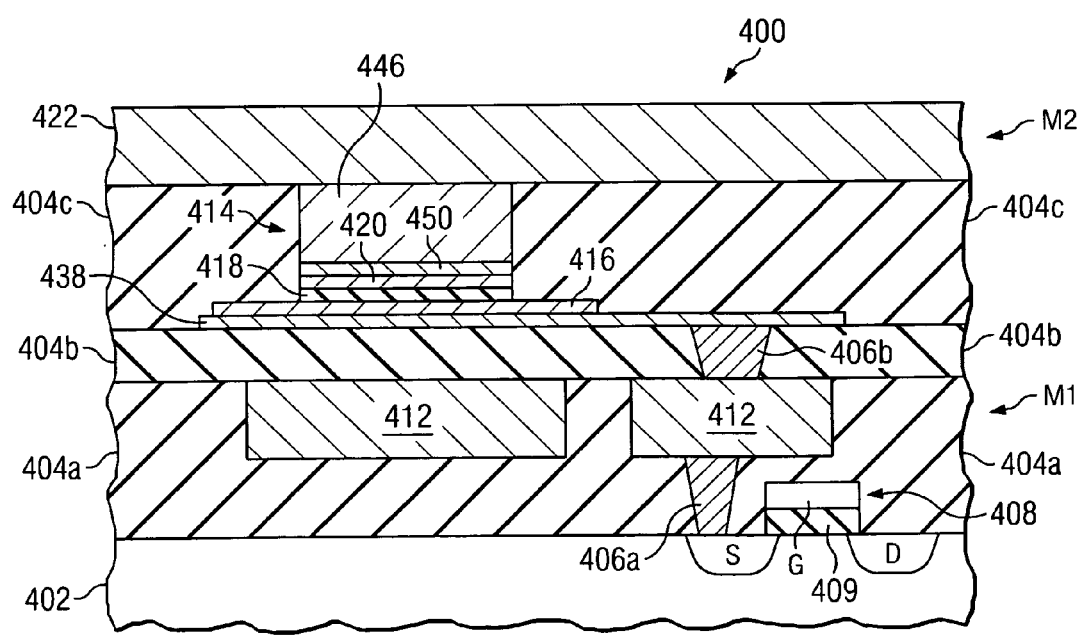
FIG. 4 shows a cross-sectional view of an embodiment of the invention implemented in a FET MRAM array.

Embodiments of the present invention have useful application in both FET MRAM arrays and crosspoint MRAM arrays. For example, a cross-sectional view of a semiconductor device 400 comprising a magnetic stack 414 described herein implemented in a FET MRAM array is shown in FIG. 4. Again, like numerals are preferably used for the various elements in FIG. 4 as were described with reference to FIGS. 1 through 3, and to avoid repetition, each reference number shown in FIG. 4 is not necessarily described again in detail herein.

The magnetic stack 414 includes the crystallization inhibiting layer 450 disposed over the free layer 420, as shown. At least a portion of the pinning layer 438 (e.g., such as the bottom electrode 330 shown in FIG. 3; not shown in FIG. 4) functions as a strap to electrically couple the fixed layer 416 to via 406*b* formed in insulating layer 404*b*. The via 406*b* is coupled to a conductive line 412 formed in insulating layer 404*a*, as shown. The conductive line 412 is connected by via 406*a* to a FET 408 comprising a source S, drain D, gate oxide 409 and gate G formed over and within the workpiece 402. A conductive line 422 is disposed over abutting the top electrode 446. A plurality of resistive memory elements (not shown) comprised of patterned magnetic stacks 414 may be disposed in an array on a single semiconductor device, for example.

Figure 5:
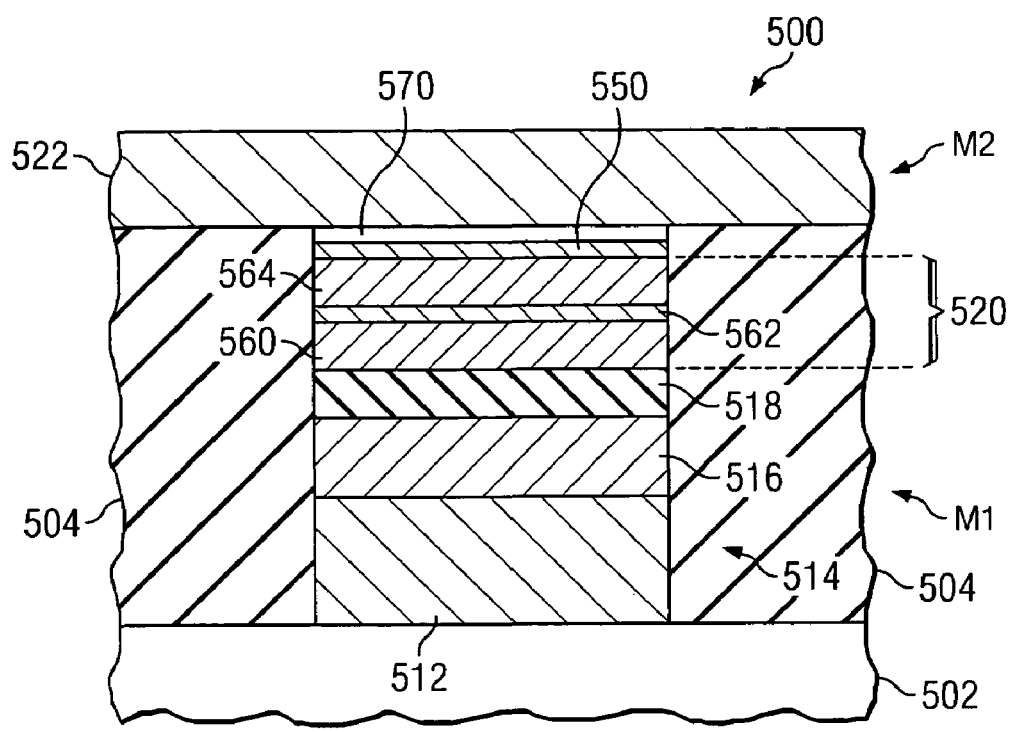
FIG. 5 shows a cross-sectional view of an embodiment of the invention implemented in a crosspoint MRAM array.

An embodiment of the present invention implemented in a crosspoint MRAM array is shown in FIG. 5 in a cross-sectional view. Again, like numerals are preferably used for the various elements in FIG. 5 as were described with reference to FIGS. 1 through 4, and to avoid repetition, each reference number shown in FIG. 5 is not necessarily described again in detail herein.

In this embodiment, there is no top electrode (such as 346 shown in FIG. 3), but rather, the crystallization inhibiting layer 550 is formed over the top surface of the free layer 520, and conductive lines 522 are formed directly over and abutting the crystallization inhibiting layer 550, for example. In this embodiment, the free layer 520 comprises two magnetic layers 560 and 564 comprising a material such as NiFe or CoFe having a thickness of about 30 Angstroms each, that sandwich a non-magnetic spacer material 562 such as Ru having a thickness of about 10 Angstroms, as examples. The non-magnetic spacer material 562 couples the two magnetic layers 560 and 564 of the free layer 520. The free layer 520 may alternatively comprise a single magnetic layer or a plurality of magnetic layers, as shown in FIGS. 3 and 4. Also, in this embodiment, the fixed layer 512 comprises a single magnetic layer or a plurality of magnetic layers, although alternatively the fixed layer 512 may comprise a sandwich as shown in FIG. 3. A plurality of resistive memory elements may be formed from the material stack 514 shown, with the resistive memory elements being separate from one another by insulating material 504 disposed over the workpiece 502, as shown.

An optional cap layer 570 may be disposed over the crystallization inhibiting layer 550, as shown, wherein the cap layer 570 comprises about 50 Angstroms or less of Ta, TaN, TiN, Ti, or combinations thereof, as examples. The optional cap layer 570 may also be used in the embodiments shown in FIGS. 3 and 4, for example.

Figure 6:
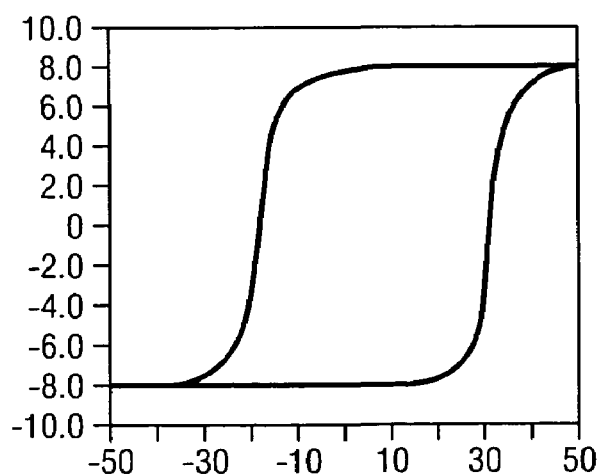
FIGS. 6 and 7 show Kerr loop graphs of magnetic stacks in a less preferred embodiment after an anneal at 400 degrees C.
Figure 7:
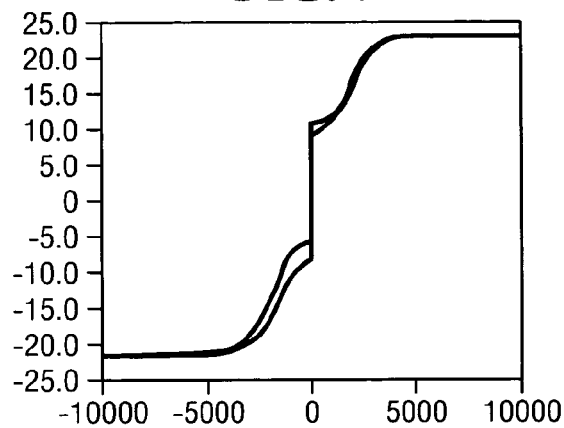
Figure 8:
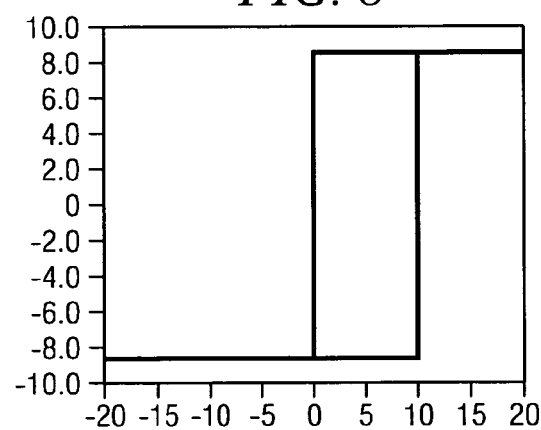
FIGS. 8 and 9 show Kerr loop graphs of magnetic stacks including the novel crystallization inhibiting layer disposed over the free layer of a magnetic stack in accordance with an embodiment of the present invention, after an anneal at 400 degrees C.
Figure 9:
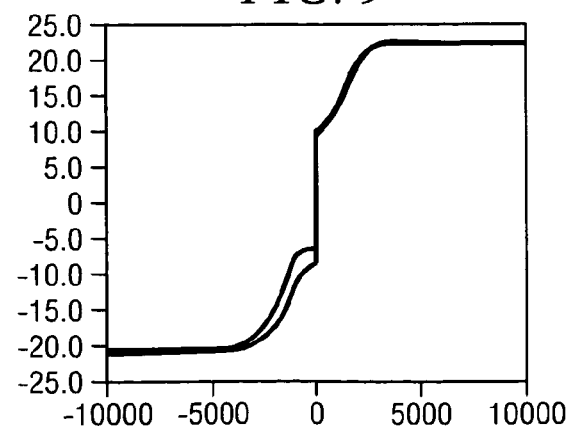

FIGS. 6 and 7 show Kerr loop graphs in the easy axis direction of magnetic stacks after an anneal at 400 degrees C., for the less preferred magnetic stack shown in FIG. 2. FIGS. 8 and 9 show Kerr loop graphs for a magnetic stack comprising the same materials, yet having an amorphous crystallization inhibiting layer comprising $Al_xO_y$ disposed over the free layer. A different scale is observed for the minor loop, indicating very high $H_c$ for the less preferred magnetic stack of FIG. 2. The sample with the crystallization inhibiting layer in accordance with embodiments of the present invention in FIGS. 8 and 9 does not show any changes in the magnetic properties after the anneal, and thus allows a controlled design of the magnetic properties in the magnetic stack.

Advantages of embodiments of the invention include improving the thermal stability of resistive memory elements and magnetic stacks of an MRAM device. The crystallization inhibiting layer 350, 450, and 550 described herein prevents the free layer 320, 420, and 520, respectively of magnetic stacks 314, 414, and 514 from crystallizing when subjected to high temperatures, thus providing improved thermal stability for resistive memory elements of an MRAM memory device. A resistive memory device that is thermally stabile at temperatures of at least 400 degrees C. may be manufactured using the novel crystallization inhibiting layer 350, 450, and 550 of the present invention, for example. The crystallization inhibiting layers 350, 450, and 550 described herein also function as a diffusion barrier, for example. MRAM devices with improved $H_c$ and CMOS compatibility advantageously result from embodiments of the present invention.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a magnetic stack of a resistive memory device over a workpiece, the method comprising:
   depositing a first magnetic material layer over the workpiece;
   depositing a tunnel insulator over the first magnetic material layer;
   depositing a second magnetic material layer over the tunnel insulator; and
   depositing a crystallization inhibiting layer over the second magnetic material layer,
wherein the crystallization inhibiting layer comprises a material selected from the group consisting of: 1) materials of the form MSiN, wherein M is a metal; 2) TaCo; 3) TiPN$_2$; 4) W$_{85}$Si$_{15}$; 5) IrTa; and 6) TaRu.

2. The method according to claim 1, wherein the crystallization inhibiting layer comprises a material of the form MSiN, where M comprises Ta, Ti, Mo, or W.

3. The method according to claim 1, wherein depositing the crystallization inhibiting layer comprises depositing a material that crystallizes at a temperature of about 400 to 450 degrees C. or greater.

4. The method according to claim 1, wherein the crystallization inhibiting layer crystallizes at a first temperature, wherein the second magnetic material layer crystallizes at a second temperature, wherein the first temperature is higher than the second temperature.

5. The method according to claim 1, wherein depositing the crystallization inhibiting layer comprises depositing an amorphous material.

6. The method according to claim 1, wherein depositing the crystallization inhibiting layer comprises depositing a material having a thickness of about 200 Angstroms or less.

7. The method according to claim 1, further comprising disposing a cap layer over the crystallization inhibiting layer.

8. The method according to claim 7, wherein disposing the cap layer comprises disposing Ta, TaN, Ti, TiN, or combinations thereof.

9. The method according to claim 1, further comprising:
   depositing a pinning layer over the workpiece, before depositing the first magnetic material layer.

10. The method according to claim 9, wherein depositing the pinning layer comprises depositing a bottom electrode material, and depositing an antiferromagnetic material over the bottom electrode material.

11. The method according to claim 1, further comprising depositing a top electrode material over the crystallization inhibiting layer.

12. The method according to claim 11, wherein depositing the top electrode material comprises depositing a conductive hard mask over the crystallization inhibiting layer, further comprising using the conductive hard mask as a mask to pattern the crystallization inhibiting layer and at least the second magnetic material layer.

13. The method according to claim 1, wherein depositing the first magnetic material layer or depositing the second magnetic material layer comprise forming a first magnetic layer, forming a non-magnetic spacer layer over the first magnetic layer, and forming a second magnetic layer over the non-magnetic spacer layer.

14. The method according to claim 1, further comprising patterning the magnetic stack to form at least one resistive memory element.

15. The method according to claim 14, wherein patterning the magnetic stack comprises forming a plurality of magnetic random access memory (MRAM) cells, wherein the MRAM cells comprise a FET MRAM array or a crosspoint MRAM array.

16. A magnetic stack of a resistive memory device, comprising:
   a first magnetic material layer;
   a tunnel insulator disposed over the first magnetic material layer;
   a second magnetic material layer disposed over the tunnel insulator; and
   a crystallization inhibiting layer disposed over the second magnetic material layer,
wherein the crystallization inhibiting layer comprises a material selected from the group consisting of: 1) materials of the form MSiN, wherein M is a metal; 2) TaCo; 3) TiPN$_2$; 4) W$_{85}$Si$_{15}$; 5) IrTa; and 6) TaRu.

17. The magnetic stack according to claim 16, wherein the crystallization inhibiting layer comprises a material of the form MSiN, where M comprises Ta, Ti, Mo, or W.

18. The magnetic stack according to claim 16, wherein the crystallization inhibiting layer comprises a material that crystallizes at a temperature of about 400 to 450 degrees C. or greater.

19. The method according to claim 16, wherein the crystallization inhibiting layer crystallizes at a first temperature, wherein the second magnetic material layer crystallizes at a second temperature, wherein the first temperature is higher than the second temperature.

20. The magnetic stack according to claim 16, wherein the crystallization inhibiting layer comprises an amorphous material.

21. The magnetic stack according to claim 16, wherein the crystallization inhibiting layer comprises a material having a thickness of about 200 Angstroms or less.

22. The magnetic stack according to claim 16, further comprising a cap layer disposed over the crystallization inhibiting layer.

23. The magnetic stack according to claim 22, wherein the cap layer comprises Ta, TaN, Ti, TiN, or combinations thereof.

24. The magnetic stack according to claim 16, further comprising a pinning layer disposed beneath the first magnetic material layer.

25. The magnetic stack according to claim 24, wherein the pinning layer comprises a bottom electrode material, and an antiferromagnetic material disposed over the bottom electrode material.

26. The magnetic stack according to claim 16, further comprising a top electrode material disposed over the crystallization inhibiting layer.

27. The magnetic stack according to claim 16, wherein the first magnetic material layer or the second magnetic material layer comprise a first magnetic layer, a non-magnetic spacer layer disposed over the first magnetic layer, and a second magnetic layer disposed over the non-magnetic spacer layer.

28. A resistive memory element formed from the magnetic stack of claim 16.

29. An array of resistive memory elements formed from the magnetic stack of claim 16.

30. The array according to claim 29, wherein the array of resistive memory elements comprises a plurality of magnetic random access memory (MRAM) cells, wherein the plurality of MRAM cells comprise a FET MRAM array or a crosspoint MRAM array.

* * * * *